(12) United States Patent
Yamada et al.

(10) Patent No.: US 7,141,304 B2
(45) Date of Patent: *Nov. 28, 2006

(54) FILM SUBSTRATE AND ITS MANUFACTURING METHOD

(75) Inventors: Taketoshi Yamada, Hino (JP); Hiroshi Kita, Hino (JP); Koichi Saito, Hino (JP); Yasushi Okubo, Hino (JP)

(73) Assignee: Konica Corporation, Tokyo (JP)

( * ) Notice: Subject to any disclaimer, the term of this patent is extended or adjusted under 35 U.S.C. 154(b) by 622 days.

This patent is subject to a terminal disclaimer.

(21) Appl. No.: 10/011,447

(22) Filed: Oct. 22, 2001

(65) Prior Publication Data

US 2002/0123209 A1   Sep. 5, 2002

(30) Foreign Application Priority Data

Dec. 25, 2000   (JP)   ............................. 2000-392502

(51) Int. Cl.
*B32B 9/02*   (2006.01)

(52) U.S. Cl. ...................... 428/447; 428/532; 428/704; 528/26; 528/42; 106/287.13; 106/287.16; 106/170.2; 525/54.21; 525/474; 525/389

(58) Field of Classification Search ........... 106/287.16, 106/287.13, 166.82, 170.2; 528/26, 42; 525/54.21, 525/474, 389; 428/447, 532, 704
See application file for complete search history.

(56) References Cited

U.S. PATENT DOCUMENTS

| | | | | | |
|---|---|---|---|---|---|
| 2,787,559 | A | * | 4/1957 | Coney et al. | ................ 427/106 |
| 3,184,327 | A | * | 5/1965 | Anderson | ................ 220/2.1 A |
| 3,206,632 | A | * | 9/1965 | Rokosz | ........................ 313/25 |
| 3,324,055 | A | * | 6/1967 | Marks et al. | ................ 527/314 |
| 4,170,690 | A | * | 10/1979 | Armbruster et al. | ......... 428/447 |
| 4,472,028 | A | * | 9/1984 | Ooue et al. | .................. 349/131 |
| 4,741,992 | A | * | 5/1988 | Przezdziecki | ............... 430/523 |
| 4,894,279 | A | * | 1/1990 | Sachdev et al. | ............. 428/216 |
| 5,352,653 | A | * | 10/1994 | Flosenzier et al. | .......... 503/227 |
| 5,744,243 | A | * | 4/1998 | Li et al. | ..................... 428/447 |
| 5,844,058 | A | * | 12/1998 | Sugama | ...................... 527/300 |

* cited by examiner

Primary Examiner—Margaret G. Moore
(74) Attorney, Agent, or Firm—Lucas & Mercanti, LLP

(57) ABSTRACT

A film substrate of an electronic displaying element, an electronic optical element, a touch panel, or a solar battery is disclosed which is composed mainly of an organic polymer having water solubility of 0 to 5 g based on 100 g of 25° C. water and having acetone solubility of 25 to 100 g based on 100 g of 25° C. acetone and an inorganic condensation polymer of a reactive metal compound capable of being condensed.

9 Claims, No Drawings

FILM SUBSTRATE AND ITS MANUFACTURING METHOD

FIELD OF THE INVENTION

The present invention relates to a transparent film substrate, and particularly to a film substrate with high transparency and low moisture permeability for an electronic displaying element, an electronic optical element, a touch panel, or a solar battery.

BACKGROUND OF THE INVENTION

As a substrate for a liquid crystal displaying element, an electronic displaying element such as an organic EL displaying element, an electronic optical element such as CCD or a CMOS sensor, or a solar battery, a glass plate has been conventionally used due to its high thermal stability, high transparency and low moisture permeability. However, as portable information devices or a cell phone prevail in recent years, a substrate, which is light, flexible, and tough, has been required as a substrate thereof in place for a glass plate, which is relatively heavy and fragile. So, plastic substrates such as a polyethersulfone substrate, a polycarbonate substrate, and a laminate of a polyethersulfone plate with an acryl resin plate as disclosed in Japanese Patent O.P.I. Publication No. 5-142525, have been proposed and put into practical use. However, their high price and their poorness of optical properties such as light transmittance and birefringence have been an obstacle to prevalence of these substrates. Further, since these plastic substrates have a negative wavelength dispersion property, compensation of polarized light cannot be made over the entire visible wavelength region in a liquid display employing a birefringence image displaying method, for example, a liquid display of a STN mode, a VA mode or an IPS mode, resulting in color deviation of a displaying color image, and contrast are lowered in an organic EL displaying element. As a resin having a positive wavelength dispersion property there are mentioned cellulose derivatives, for example, cellulose acetate propionate, however, these cellulose derivatives are not suitable for a substrate of image displaying elements on account of their too high moisture permeability.

SUMMARY OF THE INVENTION

A first object of the invention is to provide a film substrate with high transparency and low moisture permeability for an electronic displaying element, an electronic optical element, a touch panel, or a solar battery.

A second object of the invention is to provide a film substrate giving an organic EL displaying element with a long life and high contrast.

A third object of the invention is to provide a film substrate for an electronic displaying element with reduced color deviation in a liquid crystal display employing a birefringence image displaying method.

DETAILED DESCRIPTION OF THE INVENTION

The present invention has been attained by the following constitutions:

1. a film substrate of an electronic displaying element, an electronic optical element, a touch panel, or a solar battery, wherein the film substrate is composed mainly of an organic polymer having water solubility of 0 to 5 g based on 100 g of 25° C. water and having acetone solubility of 25 to 100 g based on 100 g of 25° C. acetone and an inorganic condensation polymer of a reactive metal compound capable of being condensed;

2. the film substrate of item 1 above, wherein the organic polymer comprises a repeating unit represented by formula (1), (2), (3), (4) or (5) in its main chain, or a group represented by formula (6) or (7) in its side chain,

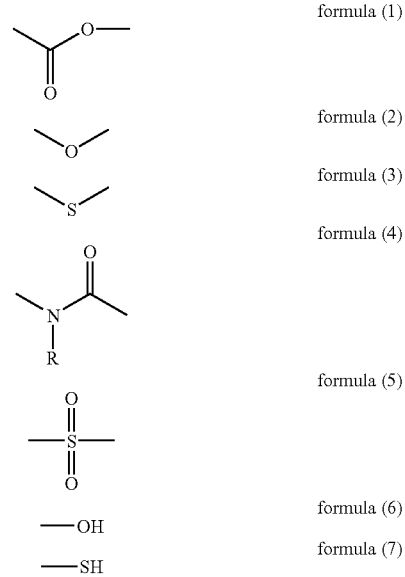

wherein R represents a hydrogen atom or a monovalent substituent;

3. the film substrate of item 1 above, wherein the organic polymer has a positive wavelength dispersion property;

4. the film substrate of item 1 above, wherein the organic polymer is a cellulose ester;

5. the film substrate of item 1 above, wherein the cellulose ester has a cellulose ester having an acyl group having 2 to 4 carbon atoms as its ester group;

6. the film substrate of item 5 above, wherein the cellulose ester is cellulose acetate propionate;

7. the film substrate of item 1 above, wherein the reactive metal compound is at least one pair of a reactive metal compound having two substituents capable of being hydrolyzed per one metal atom and a reactive metal compound having three substituents capable of being hydrolyzed per one metal atom;

8. the film substrate of item 1 above, wherein the metal of the reactive metal compound is a tetravalent metal;

9. the film substrate of item 8 above, wherein the tetravalent metal is selected from the group consisting of silicon, zirconium, titanium and germanium;

10. the film substrate of item 1 above, wherein the inorganic condensation polymer is a condensation polymer comprising in the chemical structure a monomer unit derived from a compound represented by formula (8):

wherein Rf represents an alkyl group having a fluorine atom or an aryl group having a fluorine atom; $X^1$ represents a group capable of being hydrolyzed; and n represents an integer of 1 to 3;

11. the film substrate of item 1 above, wherein the film substrate further contains an alkali metal in an amount of zero to less than 5,000 ppm by weight based on the weight of the substrate;

12. the film substrate of item 1 above, wherein the film substrate is a substrate for an organic EL displaying element;

13. the film substrate of item 1 above, wherein the film substrate is a substrate for an organic EL displaying element, and the organic polymer has a positive wavelength dispersion property;

21. a film substrate for an electronic displaying element, an electronic optical element, a touch panel, or a solar battery, wherein the film substrate is an organic-inorganic polymer hybrid film substrate composed mainly of an organic polymer having water solubility of 0 to 5 g based on 100 g of 25° C. water and having acetone solubility of 25 to 100 g based on 100 g of 25° C. acetone and a reactive metal compound capable of being condensed after hydrolysis to produce a condensation or the condensation polymer;

22. the film substrate for an electronic displaying element, an electronic optical element, a touch panel, or a solar battery of item 21 above, wherein the organic polymer comprises in the chemical structure at least one selected from the group consisting of repeating units represented by formulae (1), (2), (3), (4) and (5) described above and groups represented by formulae (6) and (7) described above, 23. the film substrate for an electronic displaying element, an electronic optical element, a touch panel, or a solar battery of item 21 or 22 above, wherein the organic polymer has a positive wavelength dispersion property;

24. the film substrate for an electronic displaying element, an electronic optical element, a touch panel, or a solar battery of item 22 or 23 above, wherein the organic polymer is a cellulose ester;

25. the film substrate for an electronic displaying element, an electronic optical element, a touch panel, or a solar battery of item 24 above, wherein the cellulose ester has a cellulose ester having an acyl group having 2 to 4 carbon atoms in its ester group;

26. the film substrate for an electronic displaying element, an electronic optical element, a touch panel, or a solar battery of item 25 above, wherein the cellulose ester is cellulose acetate propionate;

27. the film substrate for an electronic displaying element, an electronic optical element, a touch panel, or a solar battery of any one of items 21 through 26 above, wherein the film substrate comprises, as the reactive metal compound, at least one pair of a reactive metal compound having two substituents capable of being condensed after hydrolysis per one metal atom and a reactive metal compound having three substituents capable of being condensed after hydrolysis per one metal atom;

28. the film substrate for an electronic displaying element, an electronic optical element, a touch panel, or a solar battery of any one of items 21 through 27 above, wherein the metal of the reactive metal compound is a tetravalent metal;

29. the film substrate for an electronic displaying element, an electronic optical element, a touch panel, or a solar battery of item 28 above, wherein the tetravalent metal is selected from the group consisting of silicon, zirconium, titanium and germanium;

30. the film substrate for an electronic displaying element, an electronic optical element, a touch panel, or a solar battery of any one of items 21 through 29 above, wherein the film substrate comprises a compound represented by formula (8):

$$(Rf)_n Si(X^1)_{4-1} \qquad \text{formula (8)}$$

wherein Rf represents an alkyl group having a fluorine atom or an aryl group having a fluorine atom; $X^1$ represents a group capable of being hydrolyzed; and n represents an integer of 1 to 3;

31. a method of manufacturing a film substrate for an electronic displaying element, an electronic optical element, a touch panel, or a solar battery as recited in any one of items 21 through 30 above, the method comprising the steps of casting on a support a composition containing an organic polymer, a reactive metal compound capable of being condensed after hydrolysis to produce a condensed polymer or the condensation polymer, and an alkali metal in an amount of less than 5,000 ppm, and then drying to obtain a film substrate on the support;

32. the film substrate of any one of items 21 through 30 above, wherein the film substrate is a substrate for an organic EL displaying element; or 33. the film substrate of item 21 or 22 above, wherein the organic polymer has a positive wavelength dispersion property, and the film substrate is a substrate for an organic EL displaying element.

The present invention will be detailed below.

In the invention, the organic polymer (hereinafter referred to also as the organic polymer in the invention) has a solubility of 0 to 5 g based on 100 g of 25° C. water and a solubility of 25 to 100 g based on 100 g of 25° C. acetone. The organic polymer in the invention preferably comprises, in the chemical structure, at least one selected from the repeating units represented by formulae (1) through (5) and the groups represented by formulae (6) through (7).

In the invention, the organic polymer in the invention has preferably a positive wavelength dispersion property. The organic polymer having a positive wavelength dispersion property means an organic polymer in that when an acetone solution of the above organic polymer (another organic solvent or a mixture solvent of acetone with another solvent may be used for dissolving the organic polymer in the invention) is cast on a glass plate, and drying to form a film with a dry thickness of 100 μm, a value obtained by dividing a retardation within the plane R (600) of the film at wavelength 600 nm by a retardation within the plane R (450) of the film at wavelength 450 nm is more than 1.

The film substrate having a positive wavelength dispersion property can compensate a polarized light over the entire visible wavelength, provides an image free from color deviation when used in a liquid crystal display employing a birefringence image displaying method, and provides good contrast when used in an organic EL displaying element As an example of the organic polymer in the invention having a positive wavelength dispersion property, there is a cellulose ester. The cellulose ester is preferably a cellulose ester having an acyl group having 2 to 4 carbon atoms as an ester group. When in the cellulose ester, X represents a substitution degree of an acetyl group, and Y represents a substitution degree of a propanoyl group or a substitution degree of a butanoyl group, it is preferred that 2.3<X+Y<2.85 and 0<X<2.85. The range satisfying 2.3<X+Y<2.85 is preferable in view of moisture permeability of the formed film substrate and phase separation of the cellulose ester. In the cellulose ester having a propanoyl group as the ester group, a higher substitution degree of the propanoyl group is preferable. The cellulose ester in the invention is especially preferably cellulose acetate propionate.

Examples of the cellulose ester in the invention include cellulose acetate, cellulose acetate propionate, cellulose acetate butyrate, cellulose acetate phthalate, and cellulose acetate propionate butyrate. In the invention, the cellulose ester having propionate or butyrate in addition to acetate, for example, cellulose acetate propionate, cellulose acetate butyrate or cellulose acetate propionate butyrate is preferably used. The butyryl group forming butyrate may be straight-chained or branched. The cellulose acetate propionate having a propionyl group as the ester group has excellent water resistance and useful for a film substrate of a liquid crystal display. The acyl substitution degree can be measured according to a method described in ASTM-D817-96.

The number average molecular weight of the organic polymer in the invention is preferably 10,000 to 1,000,000, and more preferably 50,000 to 300,000. The number average molecular weight of the cellulose ester is preferably 70,000 to 250,000, and more preferably 80,000 to 150,000.

The content of the organic polymer in the invention in the film substrate is preferably 50 to 99% by weight, and more preferably 70 to 90% by weight.

In the invention, the "metal" means metals as described on page 71 of Saito Kazuo et al., "Shukihyo no Kagaku", published by Iwanami Shoten, that is, metals including a semi-metal.

As the reactive metal compound (hereinafter referred to also as the metal compound in the invention) capable of being condensed used in the invention, there is mentioned, for example, a metal alkoxide or a reactive metal halide. The metal in the metal alkoxide or in the reactive metal halide is preferably a tetravalent metal. The metal is more preferably selected from the group consisting of silicon, zirconium, titanium and germanium, and is especially preferably silicon. Condensation reaction in the invention does not necessarily require the presence of water, but when the metal in the metal compound in the invention is silicon, is preferably carried out in the presence of water.

In the reactive metal compound capable of being condensed used in the invention, examples of metal compounds having two substituents capable of being hydrolyzed per one metal atom include dimethyldimethoxysilane, dimethyldiethoxysilane, dimethyldiisopropoxysilane, dimethyldibutoxysilane, diethyldimethoxysilane, diethyldiethoxysilane, diethyldiisopropoxysilane, diethyldibutoxysilane, diphenyldimethoxysilane, diphenyldiethoxysilane, diphenyldiisopropoxysilane, diphenyldibutoxysilane, 3-glycidoxypropylmethyldimethoxysilane, dichlorodimethylsilane, and dichlorodiethylsilane.

In the reactive metal compound capable of being condensed used in the invention, examples of metal compounds having three substituents capable of being hydrolyzed per one metal atom include methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, phenyltrimethoxysilane, phenyltriethoxysilane, phenyltriisopropoxysilane, phenyltributoxysilane, vinyltrimethoxysilane, vinyltriethoxysilane, vinyltriisopropoxysilane, vinyltributoxysilane, 3-glycidoxypropyltrimethoxysilane, 3-aminopropyltrimethoxysilane, 2-(3,4-epoxycyclohexyl)ethyltrimethoxysilane, 3-chloropropyltrimethoxysilane, 3-mercaptopropyltrimethoxysilane, (3-acryloxypropyl)trimethoxysilane, acetoxytriethoxysilane, (heptadecafluoro-1,1,2,2-tetrahydrodecyltrimethoxysilane, (3,3,3-trifluoropropyl)trimethoxysilane, methyltrichlorosilane, ethyltrichlorosilane, and phenyltrichlorosilane. In the reactive metal compound capable of being condensed, examples of metal compounds having four substituents capable of being hydrolyzed per one metal atom include tetramethoxysilane, tetraethoxysilane, tetraisopropoxysilane, tetrabutoxysilane, titanium tetraethoxide, zirconium tetra-n-butoxide, and germanium tetraethoxide. In the invention, polycondensation reaction is preferably carried out in the presence of the metal compounds having four substituents capable of being hydrolyzed per one metal atom. In view of reducing moisture permeability, substituents other than the substituents capable of being hydrolyzed in the metal compounds having two substituents capable of being hydrolyzed per one metal atom or the metal compounds having three substituents capable of being hydrolyzed per one metal atom are preferably a substituted or unsubstituted alkyl group and a substituted or unsubstituted aryl group. The substituents of the alkyl group and the aryl group include an alkyl group (for example, a methyl group, an ethyl group, etc.); a cycloalkyl group (for example, a cyclopentyl group, a cyclohexyl group, etc.); an aralkyl group (for example, a benzyl group, a phenetyl group, etc.); an aryl group (for example, a phenyl group, a naphthyl group, etc.); a heterocyclic group (for example, a furanyl group, a thiophenyl group, a pyridyl group, etc.); an alkoxy group (for example, a methoxy group, an ethoxy group, etc.); an aryloxy group (for example, a phenoxy group, etc.); an acyl group; a halogen atom; a cyano group; an amino group; an alkylthio group; a glycidyl group; a glycidoxy group; and a vinyl group. Among the substituted alkyl groups, a glycidoxy alkyl group is preferable.

Further, it is preferred in the invention that polycondensation reaction is carried out in the presence of compounds represented by formula (8), for example, (3,3,3-trifluoropropyl)trimethoxysilane, pentafluorophenylpropyltrimethoxysilane, (heptadecafluoro-1,1,2,2-tetrahydrodecyl)triethoxysilane, (3,3,3-trifluoropropyl)trichlorosilane, pentafluorophenylpropyltrichlorosilane, and (heptadecafluoro-1,1,2,2-tetrahydrodecyl)trichlorosilane.

The inorganic condensation polymer in the invention (hereinafter referred to also as the condensation polymer in the invention) can be formed by condensation reaction of the metal compounds in the invention. The film substrate of the invention is composed of preferably a hybrid of the organic polymer in the invention and the condensation polymer in the invention, so-called an organic polymer-inorganic polymer hybrid. In order to prepare the film substrate of the invention, it is preferable to prepare a hybrid of the organic polymer in the invention and the inorganic polymer in the invention. As a method for preparing such a hybrid, there is a method called sol-gel processing. The organic polymer-inorganic polymer hybrid herein referred to means a polymer in the form of molecular dispersion, in which an organic polymer and an inorganic polymer combine with each other through a hydrogen bond, a covalent bond or an ionic bond. The domain of the polymer hybrid occupies a size of from sub-micrometer to sub-nanometer. As a method of preparing the polymer hybrid, there is a method in which an organic polymer is mixed with an inorganic polymer precursor and then polymerized, a method in which an organic polymer is mixed with an inorganic oligomer and then polymerized, or a method in which an organic polymer is mixed with an inorganic polymer.

The film substrate of the invention can be prepared according to the following method. That is, for example, the sol-gel processing is applied to a solution in which the organic polymer in the invention and the reactive metal compound capable of being condensed in the invention are dissolved in an appropriate solvent to carry out condensation reaction. The condensation reaction is carried out preferably in the presence of an acid catalyst accelerating the reaction. The resulting reaction mixture is extruded or cast on a support, dried to obtain the film substrate, and optionally subjected to heat treatment, ultraviolet irradiation treatment or plasma treatment providing a film substrate to have been cross-linked.

Examples of the acid catalyst include an inorganic acid such as hydrochloric acid, sulfuric acid, or nitric acid, and an organic acid such as acetic acid, trifluoroacetic acid, levulinic acid, citric acid, p-toluene sulfonic acid, or methane sulfonic acid. After the sol-gel reaction is completed in the presence of an acid catalyst, the resulting reaction mixture may be neutralized with a base. When the reaction mixture is neutralized with a base, the alkali metal content of the resulting mixture is preferably zero to less than 5000 ppm by weight based on the total solid content of the mixture. The acid catalyst may be used together with lewis acid, for example, a salt of acetic acid, another organic acid or phosphoric acid with a metal such germanium, titanium, aluminum, antimony or tin, or a halide of such metal. The condensation reaction of the metal compound in the invention may be completed in the reaction mixture before casting on a support or completed in the film formed after casting on a support, but is preferably completed in the reaction mixture before the casting. The condensation reaction may not be completed depending upon usage, but is preferably completed.

As the catalyst, bases can be used instead of the acid catalyst. Examples of the bases include amines, for example, monoethanolamine, diethanolamine, triethanolamine, diethylamine, triethylamine, etc.; bicyclic amines, for example, DBU (diazabicycloundecene, DBN (diazabicyclononene), etc.; ammonia; and phosphine. Further, the acids or bases can be used in combination plural times.

The catalyst used in the condensation reaction can be neutralized, removed under reduced pressure if they are volatile, or removed by washing with water.

As a solvent for dissolving the organic polymer in the invention and the metal compound in the invention to obtain the solution, a water miscible organic solvent is usually used. The solvent is preferably volatile since the solvent is necessary to be evaporated after casting or extruding the solution on a support to obtain a film substrate. Further, the solvent is a solvent, which does not react with the metal compound or catalyst used and which does not dissolve a support on which a solution containing the solvent is cast or excluded. The organic polymer in the invention and the metal compound in the invention may be dissolved in a different solvent, separately, and then the resulting solutions may be mixed.

A mixture solvent of two or more solvents may be used. Examples of the water miscible organic solvent include alcohols such as ethyl alcohol, methyl alcohol, isopropyl alcohol, n-propyl alcohol, methoxymethyl alcohol, etc, acetone, methyl ethyl ketone, tetrahydrofuran, 1,4-dioxane, 1,3-dioxolan, dimethylimidazolinone, dimethylformamide, dimethylacetoamide, acetonitrile, dimethylsulfoxide, and sulfolane. The solvent is preferably 1,3-dioxolan, ethyl alcohol, acetone, or methyl ethyl ketone.

The content of the condensation polymer in the invention in the film substrate is preferably 1 to 50% by weight, and more preferably 10 to 30% by weight.

The thickness of the film substrate of the invention is preferably 10 μm to 1 mm, and more preferably 30 to 500 μm.

The surface of the film substrate of the invention for a displaying element may be optionally covered with a layer of metal oxides, metal nitrides, metal oxynitrides or organic polymeric compounds or a laminate of these layers. The film substrate having a transparent conductive layer such as an ITO layer on one side thereof and having such a layer on the other side can reduce moisture absorption on the both sides, and overcome warpage occurring due to difference in stress of the different layers. The layer may be provided on both sides of the film substrate. Moisture permeability of the substrate, on which such a layer is provided, can be effectively reduced. Examples of the metal oxides, metal nitrides or metal oxynitrides used to form such a layer include oxides, nitrides or oxynitrides of one or more kinds of elements selected from the group consisting of silicon, zirconium, titanium, tungsten, tantalum, aluminum, zinc, indium, chromium, vanadium, tin and niobium. Among these, silicon oxide, aluminum oxide, and silicon nitride are especially preferable. A layer of the metal oxides, metal nitrides or metal oxynitrides can be formed according to a vacuum evaporation method, a spattering method, or an ion-plating method.

The film substrate of the invention is useful for a substrate of an electronic displaying element such as a liquid crystal displaying element or an organic EL displaying element; an electronic optical element; a touch panel or a solar battery; and especially useful for a substrate of an organic EL displaying element.

EXAMPLES

The present invention will be explained below with reference to examples, but is not limited thereto.

Example 1

<Preparation of Film Substrate 1 of the Invention>

Tetraethoxysilane of 29.2 g and 10.8 g of methyltriethoxysilane were dissolved in 29.2 g of ethanol, and added with 29.2 g of an aqueous 0.63 weight % hydrochloric acid solution with stirring. Ten minutes after the addition, the resulting mixture was added to 348.2 g of a 14.29 weight % cellulose acetate propionate acetone solution maintained at 50° C. with stirring. The resulting solution was refluxed for 2 hours, then cast on a glass plate and dried to obtain a thickness of 50 μm.

<Preparation of Film Substrate 2 of the Invention>

Tetraethoxysilane of 29.2 g, 5.4 g of methyltriethoxysilane and 2.4 g of (3-glycidoxypropyltrimethoxysilane were dissolved in 29.2 g of ethanol, and added with 25.2 g of an aqueous 0.63 weight % hydrochloric acid solution with stirring. Ten minutes after the addition, the resulting mixture was added to 331.7 g of a 14.29 weight % cellulose acetate propionate acetone solution maintained at 50° C. with stirring. The resulting solution was refluxed for 2 hours, then cast on a glass plate and dried to obtain a thickness of 50 μm.

<Preparation of Film Substrate 3 of the Invention>

Tetraethoxysilane of 29.2 g, 5.4 g of methyltriethoxysilane and 3.0 g of dimethyldiethoxysilane were dissolved in 29.2 g of ethanol, and added with 25.2 g of an aqueous 0.63 weight % hydrochloric acid solution with stirring. Ten minutes after the addition, the resulting mixture was added to 333.1 g of a 14.29 weight % cellulose acetate propionate acetone solution maintained at 50° C. with stirring. The resulting solution was refluxed for 2 hours, then cast on a glass plate and dried to obtain a thickness of 50 µm.

<Preparation of Film Substrate 4 of the Invention>

Tetraethoxysilane of 29.2 g, 7.2 g of phenyltriethoxysilane and 7.3 g of diphenyldimethoxysilane were dissolved in 29.2 g of ethanol, and added with 25.2 g of an aqueous 0.63 weight % hydrochloric acid solution with stirring. Ten minutes after the addition, the resulting mixture was added to 509.4 g of a 14.29 weight % cellulose acetate propionate acetone solution maintained at 50° C. with stirring. The resulting solution was refluxed for 2 hours, then cast on a glass plate and dried to obtain a thickness of 50 µm.

<Preparation of Film Substrate 5 of the Invention>

Film substrate 5 of the invention was prepared in the same manner as in film substrate 3 of the invention, except that 25.2 g of an aqueous 0.85 weight % sulfuric acid solution was added instead of 25.2 g of an aqueous 0.63 weight % hydrochloric acid solution.

<Preparation of Film Substrate 6 of the Invention>

Tetraethoxysilane of 29.2 g, 7.2 g of phenyltriethoxysilane and 7.3 g of diphenyldimethoxysilane were dissolved in 29.2 g of ethanol, and added with 25.2 g of an aqueous 0.63 weight % hydrochloric acid solution with stirring. Ten minutes after the addition, the resulting mixture was added to 509.4 g of a 14.29 weight % cellulose acetate propionate acetone solution maintained at 50° C. with stirring. The resulting solution was refluxed for 2 hours, then added with 8.6 ml of an aqueous 0.5 mmol/liter sodium hydroxide solution with stirring, then cast on a glass plate and dried to obtain a thickness of 50 µm.

<Preparation of Film Substrate 7 of the Invention>

Tetraethoxysilane of 29.2 g, 3.6 g of methyltriethoxysilane, 3.0 g of dimethyldiethoxysilane and 2.2 g of (3,3,3-trifluoropropyl)trimethoxysilane were dissolved in 29.2 g of ethanol, and added with 25.2 g of an aqueous 0.63 weight % hydrochloric acid solution with stirring. Ten minutes after the addition, the resulting mixture was added to 333.1 g of a 14.29 weight % cellulose acetate propionate acetone solution maintained at 50° C. with stirring. The resulting solution was refluxed for 2 hours, then cast on a glass plate and dried to obtain a thickness of 50 µm.

<Preparation of Film Substrate 8 of the Invention>

Tetraethoxysilane of 29.2 g, 7.2 g of phenyltriethoxysilane, 4.9 g of diphenyldimethoxysilane and 2.2 g of (3,3,3-trifluoropropyl)trimethoxysilane were dissolved in 29.2 g of ethanol, and added with 25.2 g of an aqueous 0.63 weight % hydrochloric acid solution with stirring. Ten minutes after the addition, the resulting mixture was added to 509.4 g of a 14.29 weight % cellulose acetate propionate acetone solution maintained at 50° C. with stirring. Five hours after the addition, the resulting solution was cast on a glass plate and dried to obtain a thickness of 50 µm.

The cellulose acetate propionate used for preparation of film substrates 1 through 8 above had a number average molecular weight of 100,000, an acetyl substitution degree of 2.00, and a propionyl substitution degree of 0.80.

<Preparation of Comparative Film Substrate 9>

A 40 weight % tetraethoxysilane ethanol solution of 10 g and 7.2 g of a 10 weight % polyvinyl pyrrolidone ethanol solution were mixed, and then added with 0.5 g of water and 0.1 g of an aqueous 1 mol/liter hydrochloric acid solution with stirring. The resulting mixture was stirred for 24 hours, then cast on a glass plate and dried to obtain a thickness of 50 µm.

<Preparation of Comparative Film Substrate 10>

A 10 weight % methanol solution of polyvinyl acetate as a precursor of polyvinyl alcohol was prepared. The polyvinyl acetate methanol solution of 5 g and 5 g of a 10 weight % tetramethoxysilane methanol solution were mixed, and then added with 1.6 g of an aqueous 0.1 mol/liter hydrochloric acid solution. The resulting mixture was allowed to stand at 60° C. for 24 hours, cast on a glass plate, and dried to obtain a thickness of 50 µm.

<Preparation of Comparative Film Substrate 11>

Sumilight FS-1300 produced by Sumitomo Bakelite Co., Ltd., a polyethersulfone film with a thickness of 50 µm, was designated as comparative film substrate 11.

<Preparation of Comparative Film Substrate 12>

Pureace produced by Teijin Co., Ltd., a polycarbonate film with a thickness of 100 µm, was designated as comparative film substrate 12.

<Preparation of Film Substrate 13 of the Invention>

Titanium tetraisopropoxide of 4.26 g was dissolved in 4 g of tetrahydrofuran. The resulting solution was mixed with stirring to 48.0 g of a 10 weight % cellulose acetate propionate 2-methoxyethanol solution maintained at 50° C. The resulting mixture solution was stirred at 25° C. for 8 hours, and then cast on a glass plate and dried to obtain a thickness of 50 µm. The cellulose acetate propionate used for preparation of film substrate 13 above had a number average molecular weight of 100,000, an acetyl substitution degree of 2.00, and a propionyl substitution degree of 0.80.

Inventive film substrates 1 through 8, inventive film substrate 13 and comparative film substrates 9 through 12 prepared above were evaluated for light (visible) transmittance, haze, moisture permeability, and retardation. The light (visible) transmittance and haze were measured through a TUEBIDITY METER T-2600DA produced by Tokyo Denshoku Co., Ltd. Birefringence was measured through an automatic birefringence meter KOBRA-21ADH, produced by Oji Keisoku Kiki Co., Ltd., and the retardation was represented as the product of the thickness (nm) of a film substrate and the difference between the refractive index in an X direction and the refractive index in a Y direction perpendicular to the X direction, each direction being within the plane of the substrate. The moisture permeability was measured according to a method described in JIS-Z-0208. The results are shown in Table 1.

TABLE 1

| Substrate No. | Light transmittance (%) | Haze (%) | Moisture permeability (g/m² · 24 hr) | Retardation (nm) | Remarks |
|---|---|---|---|---|---|
| 1 | 93.1 | 0.1 | 130 | 7 | Inv. |
| 2 | 93.1 | 0.1 | 121 | 7 | Inv. |
| 3 | 93.0 | 0.1 | 118 | 7 | Inv. |
| 4 | 93.0 | 0.1 | 115 | 8 | Inv. |
| 5 | 93.0 | 0.1 | 114 | 8 | Inv. |
| 6 | 92.8 | 0.1 | 112 | 8 | Inv. |
| 7 | 92.8 | 0.1 | 107 | 7 | Inv. |
| 8 | 93.0 | 0.1 | 103 | 8 | Inv. |
| 9 | 93.3 | 0.2 | 233 | 8 | Comp. |
| 10 | 93.2 | 0.1 | 202 | 7 | Comp. |
| 11 | 88.0 | 0.1 | 208 | 13 | Comp. |
| 12 | 90.0 | 0.1 | 164 | 41 | Comp. |
| 13 | 93.0 | 0.1 | 135 | 8 | Inv. |

Inv.: Inventive, Comp. Comparative

As is apparent from Table 1 above, comparative substrate Nos. 9, 10, 11 and 12 provided high moisture permeability, and comparative substrate Nos. 11 and 12 provided high birefringence, resulting in undesirable results. On the other hand, inventive substrates Nos. 1 through 8, and inventive substrate No. 13 provided high transparency, low moisture permeability, and low retardation, resulting in good results.

Example 2

A 60 nm film was formed on both sides of inventive substrates Nos. 1 through 8 and comparative substrates Nos. 9 through 12, setting $SiO_{1/2}$ as a target, employing a magnetron sputtering apparatus. Thus, two substrate samples of a 100 mm×100 mm size per each substrate were prepared. On an area of 72 mm×72 mm of one substrate sample was formed a 150 nm thick ITO (indium tin oxide) layer having a 4.5 mm pitch (4.0 mm of a solid line width and 0.5 mm of a gap) in the form of stripe. Each of the thus prepared samples was subjected to ultrasonic washing with isopropyl alcohol, dried with dried nitrogen gas, and then cleaned for 5 minutes employing UV light and ozone. Thereafter, a positive hole injection layer through an electron injection layer were formed on the ITO layer through a mask capable of providing a solid layer with an area of 72 mm×72 mm. That is, the sample was fixed on a holder of a vacuum evaporation apparatus. Further, 200 mg of N,N'-diphenyl-N,N'-bis(3-methylphenyl)-[1,1'-biphenyl]-4,4'-diamine (TPD) were placed in a first molybdenum resistive heating boat, 200 mg of 4,4'-bis (2,2'-diphenylvinyl) biphenyl(D-PVBi) were placed in a second molybdenum resistive heating boat, 200 mg of OXD-7 (described below) were placed in a third molybdenum resistive heating boat, and the boats were placed in the vacuum evaporation apparatus.

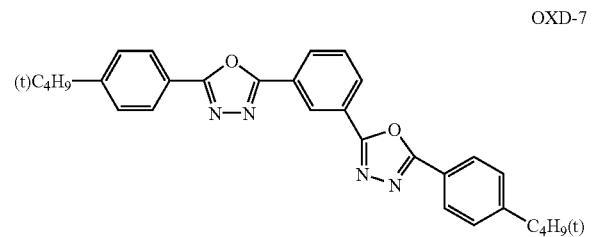

OXD-7

Then, the pressure in the vacuum tank was reduced to $4\times10^{-4}$ Pa. The heating boat carrying TPD was heated by applying an electric current to evaporate TDP on the sample at an evaporation rate of from 0.1 to 0.3 nm/sec and to form a positive hole injection layer with a thickness of 60 nm on the ITO layer. Then, the heating boat carrying DPVBi was heated to 220° C. by applying an electric current to evaporate DPVBi on the positive hole injection layer at an evaporation rate of from 0.1 to 0.3 nm/sec and to form a light emission layer with a thickness of 40 nm. Further, the heating boat carrying OXD-7 was heated by applying an electric current to evaporate OXD-7 on the light emission layer at an evaporation rate of 0.1 nm/sec, and to form an electron injection layer with a thickness of 20 nm. Temperature of the sample during evaporation was room temperature.

Next, the vacuum tank was opened, and a mask was brought into close contact with the electron injection layer at the portion corresponding to the area described above of 72 mm×72 mm to form a film having a 1.5 mm pitch (a solid line width of 1.4 and a gap of 0.1 mm) in the form of stripe. Thereafter, magnesium was placed in the molybdenum heating boat and silver was placed in the tungsten evaporation basket. Then, the pressure in the vacuum tank was reduced to $2\times10^{-4}$ Pa, and magnesium was evaporated at an evaporation rate of from 1.5 to 2.0 nm/sec by applying an electric current to the boat carrying the magnesium. At the same time the basket carrying the silver was heated so that the silver was evaporated at an evaporation rate of 0.1 nm/sec. Thus, a counter electrode composed of a mixture of magnesium and silver was formed. Herein, the mask was brought into close contact with the electron injection layer so that the counter electrode and the transparent electrode crossed and a terminal of each electrode was open. Next, a two-liquid type epoxy adhesive (Araldide, produced by Ciba Geigy Co., Ltd.) was coated through a dispenser at a line width of 1 mm on the perimeter of the area of 72 mm×72 mm in which the counter electrode and ITO electrode crossed. The other substrate sample was laminated onto the resulting coated substrate at a nitrogen atmosphere, and the adhesive was hardened to obtain an organic EL displaying element.

A polarizing plate and ¼ λ plate was laminated on the outer surface of the film substrate with an anode (ITO) of the resulting organic EL displaying *element*. A direct current of 10 V was applied under atmospheric pressure to the resulting element, and the half life of luminance was measured. The life of luminance was represented by a relative value when the half life of luminance of a comparative organic EL displaying element prepared employing comparative film substrate 12 was set at 100. The results are shown in Table 2.

TABLE 2

| | Half life of luminance (relative value) |
|---|---|
| Organic EL element employing inventive film substrate 1 | 164 |
| Organic EL element employing inventive film substrate 2 | 175 |
| Organic EL element employing inventive film substrate 3 | 179 |
| Organic EL element employing inventive film substrate 4 | 188 |
| Organic EL element employing inventive film substrate 5 | 189 |
| Organic EL element employing inventive film substrate 6 | 202 |
| Organic EL element employing inventive film substrate 7 | 210 |
| Organic EL element employing inventive film substrate 8 | 216 |
| Organic EL element employing comparative film substrate 9 | 62 |
| Organic EL element employing comparative film substrate 10 | 51 |
| Organic EL element employing comparative film substrate 11 | 72 |
| Organic EL element employing comparative film substrate 12 | 100 |

Further, contrast of each of the resulting organic EL displaying elements was visually observed and evaluated. As a result, organic EL element employing comparative film substrates 9, 10, 11 and 12 provided low contrast, resulting in undesirable results. On the other hand, organic EL displaying element employing inventive film substrates 1 through 8 provided high contrast, resulting in good results.

As is apparent from Table 2 and the contrast evaluation, organic EL displaying elements employing the film substrate of the invention have long life and high contrast. Accordingly, the film substrate of the invention has proved to be an excellent film substrate for an organic EL displaying element.

Example 3

The polarizing plate used in a color liquid crystal display VL-1530S produced by Fujitsu Co., Ltd. was peeled from the liquid crystal cell. Subsequently, each of inventive film substrates 1 to 8 and comparative film substrates 9 to 12 were laminated on the liquid crystal cell, and further, the peeled polarizing plate were again laminated on the film substrate. The resulting laminate was installed in the color liquid crystal display, and color deviation thereof was compared with that of the display without the film substrate. Comparative film substrates 9 to 12 provided an increased color deviation, resulting in undesirable results. On the other hand, inventive film substrates 1 to 8 provided a reduced color deviation, resulting in good results.

Example 4

<Preparation of Film Substrate 21 of the Invention>

Tetraethoxysilane of 29.2 g and 10.8 g of methyltriethoxysilane were dissolved in 29.2 g of ethanol, and added with 29.2 g of an aqueous 0.63 weight % hydrochloric acid solution with stirring. Ten minutes after the addition, the resulting mixture was added to 348.2 g of a 14.29 weight % cellulose acetate propionate acetone solution maintained at 50° C. with stirring. The resulting solution was refluxed for 2 hours, and filtered with Azumi filter paper No. 244 produced by Azumi Roshi Co., Ltd. to obtain a dope 21. The cellulose acetate propionate used here had a number average molecular weight of 100,000, an acetyl substitution degree of 2.00, and a propionyl substitution degree of 0.8.

The resultant dope 21 was cast onto a stainless steel belt in the loop form at 25° C. The cast dope was dried for two minutes on the stainless steel belt whose reverse side was brought into contact with 40° C. water, while 40° C. air was applied, then cooled for 15 seconds on the stainless steel belt whose reverse side was brought into contact with 15° C. cooled water, and peeled from the belt to obtain a web. The amount of the residual solvent in the web was 40% by weight. Thereafter, the both edges of the peeled web were held with clips employing a tenter, and the web was stretched in the transverse direction by a factor of 1.05 at 90° C. by changing the interval of the clips in the transverse direction. After that, the stretched web was dried at 125° C. for 10 minutes while transporting with the rollers in a drying zone. Thus, a film substrate 21 (inventive) with a thickness of 80 μm and a width of 1.3 m was obtained.

<Preparation of Film Substrate 22 of the Invention>

Tetraethoxysilane of 29.2 g, 5.4 g of methyltriethoxysilane and 2.4 g of (3-glycidoxypropyl)-trimethoxysilane were dissolved in 29.2 g of ethanol, and added with 25.2 g of an aqueous 0.63 weight % hydrochloric acid solution with stirring. Ten minutes after the addition, the resulting mixture was added to 331.7 g of a 14.29 weight % cellulose acetate propionate acetone solution maintained at 50° C. with stirring. The resulting solution was refluxed for 2 hours, and filtered with Azumi filter paper No. 244 produced by Azumi Roshi Co., Ltd. to obtain a dope 22. The cellulose acetate propionate used here had a number average molecular weight of 100,000, an acetyl substitution degree of 1.9, and a propionyl substitution degree of 0.7.

The resultant dope 22 was cast onto a stainless steel belt in the loop form at 25° C. The cast dope was dried for two minutes on the stainless steel belt whose reverse side was brought into contact with 40° C. water, then cooled for 15 seconds on the stainless steel belt whose reverse side was brought into contact with 15° C. cooled water, and then peeled from the belt to obtain a web. The amount of the residual solvent in the peeled web was 40% by weight. Thereafter, the both edges of the peeled web were held with clips employing a tenter, and the web was stretched in the transverse direction by a factor of 1.03 at 90° C. by changing the interval of the clips in the transverse direction. After that, the stretched web was dried at 130° C. for 10 minutes while transporting with the rollers in a drying zone. Thus, a film substrate 22 (inventive) with a thickness of 80 μm and a width of 1.3 m was obtained.

<Preparation of Film Substrate 23 of the Invention>

Tetraethoxysilane of 29.2 g, 5.4 g of methyltriethoxysilane and 3.0 g of dimethyldiethoxysilane were dissolved in 29.2 g of ethanol, and added with 25.2 g of an aqueous 0.63 weight % hydrochloric acid solution with stirring. Ten minutes after the addition, the resulting mixture was added to 331.1 g of a 14.29 weight % cellulose acetate propionate acetone solution maintained at 50° C. with stirring. The resulting solution was refluxed for 2 hours, and filtered to obtain a dope 23. The cellulose acetate propionate used here had a number average molecular weight of 100,000, an acetyl substitution degree of 2.0, and a propionyl substitution degree of 0.8.

The resultant dope 23 was cast onto a stainless steel belt in the loop form at 25° C. The cast dope was dried for two minutes on the stainless steel belt whose reverse side was brought into contact with 40° C. water, then cooled for 15 seconds on the belt whose reverse side was brought into contact with 15° C. cooled water, and then peeled from the belt to obtain a web. The amount of the residual solvent in the peeled web was 40% by weight. Thereafter, the both edges of the peeled web were held with clips employing a tenter, and the web was stretched in the transverse direction by a factor of 1.05 at 90° C. by changing the interval of the clips in the transverse direction. After that, the stretched web was dried at 120° C. for 15 minutes while transporting with the rollers in a drying zone. Thus, a film substrate 23 (inventive) with a thickness of 80 μm and a width of 1.3 m was obtained.

<Preparation of Film Substrate 24 of the Invention>

Tetraethoxysilane of 29.2 g, 7.2 g of phenyltriethoxysilane and 7.3 g of diphenyldimethoxysilane were dissolved in 29.2 g of ethanol, and added with 25.2 g of an aqueous 0.63 weight % hydrochloric acid solution with stirring. Ten minutes after the addition, the resulting mixture was added to 509.4 g of a 14.29 weight % cellulose acetate propionate acetone solution maintained at 50° C. with stirring. The resulting solution was refluxed for 2 hours, and filtered with Azumi filter paper No. 244 produced by Azumi Roshi Co., Ltd. to obtain a dope 24. The cellulose acetate propionate used here had a number average molecular weight of 100,000, an acetyl substitution degree of 1.8, and a propionyl substitution degree of 0.6.

The resultant dope 24 was cast onto a stainless steel belt in the loop form at 30° C. The cast dope was dried for one minute on the stainless steel belt whose reverse side was heated with 45° C. air, while 55° C. air was applied from the cast dope side, then cooled for 15 seconds on the belt whose reverse side was brought into contact with 15° C. cooled water, and then peeled from the belt to obtain a web. The amount of the residual solvent in the peeled web was 80% by weight. The resulting web was transported with the rollers in a drying zone maintained at 80° C. Thereafter, the both edges of the web were held with clips employing a tenter, and the web was stretched in the transverse direction by a factor of 1.07 at 90° C. by changing the interval of the clips in the transverse direction. After that, the stretched web was dried at 125° C. for 10 minutes while transporting with the rollers. Thus, a film substrate 24 (inventive) with a thickness of 80 µm and a width of 1.3 m was obtained.

<Preparation of Film Substrate 25 of the Invention>

Tetraethoxysilane of 29.2 g, 3.6 g of methyltriethoxysilane, 3.0 g of dimethyldiethoxysilane and 2.2 g of (3,3,3-trifluoropropyl)trimethoxysilane were dissolved in 29.2 g of ethanol, and added with 25.2 g of an aqueous 0.63 weight % hydrochloric acid solution with stirring. Ten minutes after the addition, the resulting mixture was added to 333.1 g of a 14.29 weight % cellulose acetate acetone solution maintained at 50° C. with stirring. The resulting solution was refluxed for 2 hours, and filtered with Azumi filter paper No. 244 produced by Azumi Roshi Co., Ltd. to obtain a dope 25. The cellulose acetate propionate used here had a number average molecular weight of 100,000, an acetyl substitution degree of 2.5.

The resultant dope 25 was cast onto a stainless steel belt in the loop form at 30° C. The cast dope was dried for 90 seconds on the stainless steel belt whose reverse side was heated with 43° C. air, while 50° C. air was applied from the cast dope side, then cooled for 10 seconds on the belt whose reverse side was brought into contact with 12° C. cooled water, and then peeled from the belt to obtain a web. The amount of the residual solvent in the peeled web was 70% by weight. The resulting web was transported with the rollers in a drying zone maintained at 80° C. Thereafter, the both edges of the web were held with clips employing a tenter, and the web was stretched in the transverse direction by a factor of 1.06 at 90° C. by changing the interval of the clips in the transverse direction. After that, the stretched web was dried at 120° C. for 15 minutes while transporting with the rollers. Thus, a film substrate 25 (inventive) with a thickness of 80 µm and a width of 1.3 m was obtained.

<Preparation of Film Substrate 26 of the Invention>

Tetraethoxysilane of 29.2 g, 7.2 g of phenyltriethoxysilane, 4.9 g of diphenyldimethoxysilane and 2.2 g of (3,3,3-trifluoropropyl)trimethoxysilane were dissolved in 29.2 g of ethanol, and added with 25.2 g of an aqueous 0.63 weight % hydrochloric acid solution with stirring. Ten minutes after the addition, the resulting mixture was added to 509.4 g of a 14.29 weight % cellulose acetate propionate acetone solution maintained at 50° C. with stirring. Five hours after, the resulting solution was filtered with Azumi filter paper No. 244 produced by Azumi Roshi Co., Ltd. to obtain a dope 26. The cellulose acetate propionate used here had a number average molecular weight of 100,000, an acetyl substitution degree of 1.8, and a propionyl substitution degree of 0.8.

The resultant dope 26 was cast onto a stainless steel belt in the loop form at 30° C. The cast dope was dried for 90 seconds on the stainless steel belt whose reverse side was heated with 55° C. air, while 60° C. air was applied from the cast dope side, cooled for 10 seconds on the belt whose reverse side was brought into contact with 12° C. cooled water, and then peeled from the belt to obtain a web. The amount of the residual solvent in the peeled web was 40% by weight. The resulting web was transported with the rollers in a drying zone maintained at 80° C. Thereafter, the both edges of the web were held with clips employing a tenter, and the web was stretched in the transverse direction by a factor of 1.06 at 90° C. by changing the interval of the clips in the transverse direction. After that, the stretched web was dried at 125° C. for 15 minutes while transporting with the rollers. Thus, a film substrate 26 (inventive) with a thickness of 80 µm and a width of 1.3 m was obtained.

<Preparation of Film Substrate 27 (Comparative)>

A film substrate 27 (comparative) was prepared in the same manner as in film substrate 21 above, except that the following dope A was used instead of dope 21.

Dope A

| | |
|---|---|
| Cellulose acetate propionate (number average molecular weight: 100,000; Acetyl substitution degree: 2.0; propionyl substitution degree: 0.8) | 81 g |
| Triphenyl phosphate | 9 g |
| Acetone | 360 g |

<Preparation of Film Substrate 28 (Comparative)>

A film substrate 28 (comparative) was prepared in the same manner as in film substrate 21 above, except that the following dope B was used instead of dope 21.

Dope B

| | |
|---|---|
| Cellulose acetate propionate (number average molecular weight: 100,000; Acetyl substitution degree: 2.0; propionyl substitution degree: 0.8) | 90 g |
| Acetone | 360 g |

Inventive film substrates 21 through 26, and comparative film substrates 27 and 28 prepared above were evaluated for light (visible) transmittance, haze, moisture permeability, and retardation. The light (visible) transmittance and haze were measured through a TURBIDITY METER T-2600DA produced by Tokyo Denshoku Co., Ltd. The substrates were measured through an automatic birefringence meter KOBRA-21ADH, produced by Oji Keisoku Kiki Co., Ltd., and retardation ($R_0$) within the planes was computed from measurement of the three dimensional refractive indices. The moisture permeability was measured according to a method described in JIS-Z-0208. The center line average surface roughness $R_a$ of the substrates was measured through an optical interference surface roughness meter (produced by WYKO Co., Ltd.). The results are shown in Table 3.

TABLE 3

| Substrate No. | $R_0$ (nm) | Moisture permeability (g/m² · 24 hr) | Haze (%) | Light transmittance (%) | Ra (µm) | Re-marks |
|---|---|---|---|---|---|---|
| 21 | 0 | 88 | 0.0 | 93 | 0.01 | Inv. |
| 22 | 2 | 80 | 0.0 | 93 | 0.01 | Inv. |
| 23 | 1 | 76 | 0.0 | 93 | 0.01 | Inv. |
| 24 | 2 | 89 | 0.0 | 93 | 0.01 | Inv. |
| 25 | 1 | 95 | 0.0 | 93 | 0.01 | Inv. |
| 26 | 1 | 75 | 0.0 | 93 | 0.01 | Inv. |
| 27 | 5 | 195 | 0.1 | 92 | 0.02 | Comp. |
| 28 | 3 | 340 | 0.1 | 92 | 0.02 | Comp. |

Inv.: Inventive, Comp. Comparative

As is apparent from Table 3 above, comparative substrate Nos. 27 and 28 provided high moisture permeability. In contrast, inventive substrates Nos. 21 through 26 provided low moisture permeability, good optical properties, and good surface roughness.

EFFECTS OF THE INVENTION

The present invention can provide a film substrate with high transparency, low moisture permeability and low retardation for an electronic displaying element, an electronic optical element, a touch panel, or a solar battery. The present invention can provide a film substrate for an electronic displaying element, an electronic optical element, a touch panel, or a solar battery, which is suitable for a displaying element employing a birefringence image displaying method. Further, present invention can provide a film substrate for an electronic displaying element, giving an organic EL displaying element with a long life and high contrast. Furthermore, the present invention can provide a film substrate for an electronic displaying element with a reduced color deviation in a liquid crystal display employing a birefringence image displaying method.

What is claimed is:

1. A film substrate having a thickness of 30 to 500 µm, prepared by a process comprising the steps of:
   a) preparing a mixture solution by mixing an organic polymer, which has a water solubility of 0 to 5 g based on 100 g of 25° C. water and has an acetone solubility of 25 to 100 g based on 100 g of 25° C. acetone, and a reactive metal compound under a reaction accelerating condition, so as to form a condensation polymer from said reactive metal compound and a hybrid from said organic polymer and said condensation polymer,
   b) casting the mixture solution on a substrate; and
   c) drying the mixture solution on the substrate to obtain the film substrate having the thickness of 30 to 500 µm,
wherein the reactive metal compound is at least one pair of a reactive metal compound having two substituents capable of being hydrolyzed per one metal atom and a reactive metal compound having three substituents capable of being hydrolyzed per one metal atom.

2. The film substrate of claim 1, wherein the organic polymer is a cellulose ester having an acyl group having 2 to 4 carbon atoms as its ester group.

3. The film substrate of claim 2, wherein the cellulose ester is cellulose acetate propionate.

4. The film substrate of claim 1, wherein the metal of the reactive metal compound is a tetravalent metal.

5. The film substrate of claim 4, wherein the tetravalent metal is selected from the group consisting of silicon, zirconium, titanium and germanium.

6. The film substrate of claim 1, wherein the condensation polymer comprises in the chemical structure a monomer unit derived from a compound represented by formula (8)

$$(Rf)_n Si (X^1)_{4-n} \qquad \text{formula (8)}$$

wherein Rf represents an alkyl group having a fluorine atom or an aryl group having a fluorine atom; $X^1$ represents a group capable of being hydrolyzed; and n represents an integer of 1 to 3.

7. The film substrate of claim 1, wherein the film substrate further contains an alkali metal in an amount of zero to less than 5,000 ppm by weight based on the weight of the support.

8. The film substrate of claim 1, wherein the film substrate is a substrate for an organic EL displaying element.

9. The film substrate of claim 1, wherein the film substrate is a substrate for an organic EL displaying element, and the organic polymer has a positive wavelength dispersion property.

* * * * *